(12) United States Patent
Bacha et al.

(10) Patent No.: US 8,027,489 B1
(45) Date of Patent: Sep. 27, 2011

(54) MULTI-VOLTAGE BIASING SYSTEM WITH OVER-VOLTAGE PROTECTION

(75) Inventors: Georges El Bacha, Boston, MA (US); Stuart Patterson, East Walpole, MA (US); Ara Arakelian, Watertown, MA (US)

(73) Assignee: Analog Devices, Inc., Norwood, MA (US)

( * ) Notice: Subject to any disclaimer, the term of this patent is extended or adjusted under 35 U.S.C. 154(b) by 1391 days.

(21) Appl. No.: 11/483,005

(22) Filed: Jul. 7, 2006

(51) Int. Cl.
*H04R 3/00* (2006.01)
*H03G 11/00* (2006.01)
*H02H 3/20* (2006.01)

(52) U.S. Cl. .......... 381/113; 381/55; 381/122; 361/91.1

(58) Field of Classification Search .............. 381/91, 381/122, 111–115, 174, 55, 92, 120; 330/259, 330/267, 270, 279, 296–7, 134, 199–200, 330/207 P; 361/18, 90–91.8
See application file for complete search history.

(56) References Cited

U.S. PATENT DOCUMENTS

| | | | |
|---|---|---|---|
| 4,647,872 A * | 3/1987 | Johnson ..................... 330/311 |
| 5,577,129 A * | 11/1996 | Ehara ........................ 381/113 |
| 6,275,112 B1 | 8/2001 | Muza | |
| 6,577,187 B1 * | 6/2003 | Lesko .......................... 330/11 |
| 6,608,905 B1 | 8/2003 | Muza et al. | |
| 6,664,857 B2 * | 12/2003 | Ausserlechner ............ 330/297 |
| 6,842,525 B1 * | 1/2005 | Mellot ......................... 381/92 |
| 7,119,622 B2 * | 10/2006 | Sato .......................... 330/296 |
| 7,193,459 B1 * | 3/2007 | Epperson et al. ........... 330/130 |
| 7,239,494 B2 * | 7/2007 | Naffziger .................. 361/91.1 |
| 7,372,967 B2 * | 5/2008 | Henson et al. ............. 381/111 |
| 7,620,189 B2 * | 11/2009 | Lang et al. ................. 381/113 |
| 7,688,987 B2 * | 3/2010 | Boor ........................ 381/111 |
| 2004/0150454 A1 | 8/2004 | Bhattacharya et al. | |
| 2006/0125521 A1 | 6/2006 | Kim | |
| 2006/0147062 A1 * | 7/2006 | Niwa et al. ................. 381/113 |
| 2009/0207544 A1 * | 8/2009 | Boyko et al. ............. 361/91.1 |

\* cited by examiner

*Primary Examiner* — Xu Mei
(74) *Attorney, Agent, or Firm* — Bingham McCutchen LLP

(57) ABSTRACT

A multi-voltage biasing system with over voltage protection has an amplifier with a stage including at least one output device and one cascode protection device having a predetermined maximum recommended voltage; a biasing network is selectively responsive to a plurality of different supply voltages at least one of which is higher than the maximum recommended voltage for providing to the stage a bias voltage to operate the cascode device and output device below their maximum recommended voltages.

25 Claims, 4 Drawing Sheets

MULTI-VOLTAGE BIASING SYSTEM WITH OVER-VOLTAGE PROTECTION

FIELD OF THE INVENTION

This invention relates to a multi-voltage biasing system with over-voltage protection and more particularly to a dual power supply microphone biasing system with over-voltage protection.

BACKGROUND OF THE INVENTION

Traditionally, microphone bias pins are expected to deliver 3.75 V and currents up to 1.6 mA to bias mono or stereo electret microphones. So far 0.35 um CMOS, or larger geometries have been used to design audio codecs. These technologies offer 5V tolerant transistors and thus a simple operational amplifier is used in a non-inverting configuration to achieve the desired results. To accommodate more audio channels, and maintain a reasonable die size, switching to smaller geometries, like 0.18 um, is eminent. This however offers a new challenge since 5V tolerant transistors are not available on such geometries. To solve that problem a number of voltage biasing circuit schemes are available.

In one approach two power supply voltages can be made available: 3.3V to operate the input stage and 5.0V to operate the output stage and provide the conventional 3.75V bias for the microphone. One problem that arises from this is the need to protect the one or more transistors in the output stage from over voltage from the 5V supply that would lead to premature device failure, e.g. due to exceeding maximum recommended voltage of the device. Herein, maximum recommended voltage refers to the voltage across any two terminals of a device that should not be exceeded (for example in 0.18 um, the maximum recommended voltage of high voltage transistors is 3.63V). Another problem is to protect those transistors especially if the 5V power supply is powered up before the 3.3V. This protection must apply when both the 5.0V and 3.3V power supplies are on, or when the 5.0V power supply is the only one available e.g. such as can occur during system power-ups or power-downs. In another approach a single 5V power supply can be used to operate the entire circuit. This is a less practical solution, since all the transistors used in input and output stages will need protection.

SUMMARY OF THE INVENTION

It is therefore an object of this invention to provide an improved multi-voltage biasing system with over-voltage protection.

It is a further object of this invention to provide such an improved multi-voltage biasing system with over-voltage protection which operates with a plurality of different supply voltages at least one of which is greater than the maximum recommended voltage of the devices used.

It is a further object of this invention to provide such an improved multi-voltage biasing system with over-voltage protection which operates even with only one supply voltage less than the maximum recommended voltage.

It is a further object of this invention to provide such an improved multi-voltage biasing system with over-voltage protection which is simple and easy to implement and uses little additional power and area.

It is a further object of this invention to provide such an improved multi-voltage biasing system with over-voltage protection which has an improved power supply rejection ratio.

It is a further object of this invention to provide such an improved multi-voltage biasing system with over-voltage protection which is robust regardless of power supply sequencing e.g. it makes no difference whether the higher or lower voltage power supply powers up first.

The invention results from the realization that a multi-voltage system can be built with devices whose maximum recommended voltages are below at least one of the supply voltages yet are protected from over voltage by using an amplifier having a stage including at least one output device and one cascode protection device and a biasing network selectively responsive to the supply voltage to provide to the output stage a bias voltage to operate the cascode device and output device below their maximum recommended voltages.

This invention features a multi-voltage biasing system with over voltage protection including an amplifier having a stage including at least one output device and one cascode protection device having a predetermined maximum recommended voltage. There is a biasing network selectively responsive to a plurality of different supply voltages at least one of which is higher than the maximum recommended voltage for providing to the stage a bias voltage to operate the cascode device and output device below their maximum recommended voltages.

In a preferred embodiment there may be a detector circuit for detecting the supply voltage applied to the biasing network. There may be a variable gain circuit for setting the gain of the amplifier and there may be a control logic circuit responsive to the detected supply voltage for adjusting the gain of the amplifier. The stage may be an output stage. The amplifier may include an input stage and the output stage and the input stage may have applied to it a supply voltage below the maximum recommended voltage and the output stage may have a supply voltage above or below the maximum recommended voltage applied to it. The biasing network may include a voltage divider; it may include a resistance divider. The stage may include a plurality of output devices and cascode protection devices. The devices may be transistors; they may be CMOS transistors. The amplifier may be fabricated in 0.18 um CMOS technology. The amplifier may provide a bias for a microphone. The supply voltages may include approximately 5.0 volts and 3.3 volts with a maximum recommended voltage may be approximately 3.63 volts.

The invention also features a dual biasing microphone power supply system including an amplifier having an input stage and an output stage including at least one output device and one cascode protection device having a predetermined maximum recommended voltage. There is a biasing network responsive to plurality of different supply voltages at least one of which is higher than the maximum recommended voltage for providing to the output stage a bias voltage to operate the cascode device and the output device below their maximum recommended voltages.

In a preferred embodiment there may be a detector circuit for detecting the supply voltage applied to the biasing network. There may be a variable gain circuit for setting the gain of the amplifier and there may be a control logic circuit responsive to the detector supply voltage for adjusting the gain of the amplifier. The input stage may have applied to it a supply voltage below the maximum recommended voltage and the output stage may have a supply voltage above or below the maximum recommended voltage applied to it. The biasing network may include a voltage divider; the voltage divider may be a resistance voltage divider. The output stage may include a plurality of output devices and cascode protection devices. The devices may be transistors; the transistors may be CMOS transistors. The amplifier may be fabricated in 0.18 um CMOS technology. The supply voltages may include approximately 5 volts and 3.3 volts and the maximum recommended voltage may be approximately 3.63V volts.

This invention also features a multi-voltage system with over-voltage protection including an amplifier having a stage including at least one output device and one cascode protection device, having a predetermined maximum recommended voltage; and a biasing network selectively responsive to a plurality of different supply voltages, at least one of which is higher than the maximum recommended voltage, for providing to the stage, a bias voltage to operate the cascode device and output device below their maximum recommended voltages.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
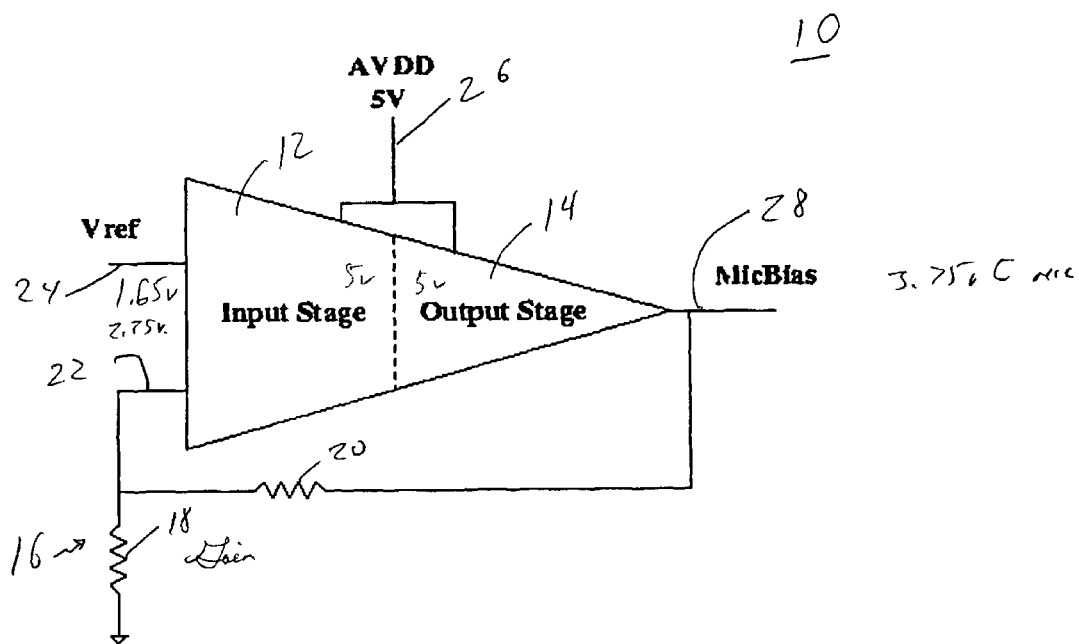
FIG. 1 is a schematic diagram of a prior art microphone biasing amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a microphone biasing amplifier 10 including an input stage 12 and an output stage 14. There is a feedback network 16 including resistors 18 and 20 which operate to set the gain of amplifier 10. The inputs to input stage 12 include the feedback input 22 and Vref 24 which may for example be 1.65V or 2.25V. The power supply voltage to amplifier 10 is typically 5V as indicated at 26. There is provided at the output 28 a 3.75 volts bias for the microphone. Input 12 and output 14 stages are typically formed with CMOS 0.35 um technology wherein the transistor junctions can safely operate with the 5V power supply.

Figure 2:
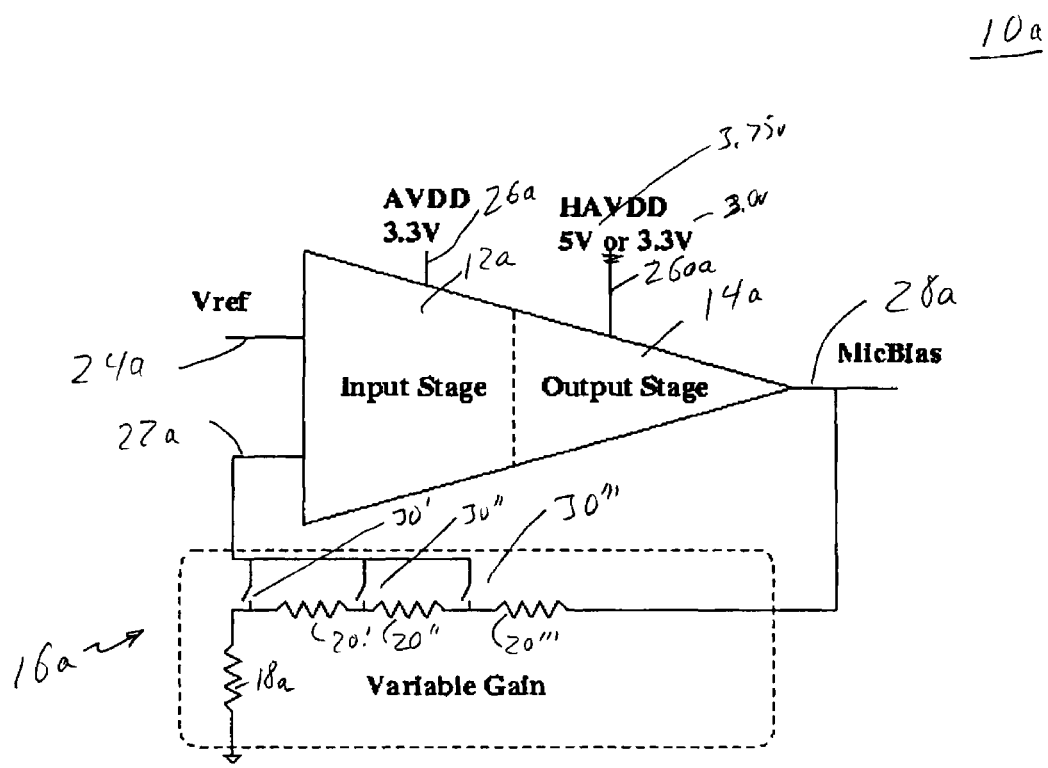
FIG. 2 is a schematic diagram of a microphone biasing amplifier according to this invention.

However, the demand for smaller area and lower power amplifiers is driving the CMOS technology from the 0.35 um to the 0.18 um geometries and smaller. At this lower voltage geometry the transistor junction can not safely operate at 5V but must operate at 3.3V or below. Using a 3.3V supply will result in a microphone bias output at 28 of <3.3 volts which may be acceptable in some cases but not all. To accommodate these changes amplifier 10a, FIG. 2, according to this invention operates the input stage 12a with the 3.3V voltage supply 26a, while the output stage 14a can be operated at either 3.3V or 5V voltage supply 26aa depending on, among other things, whether the user determines that a ≦3.3V microphone bias on output 28a is acceptable or the traditional 3.75V microphone bias is more desirable. Feedback gain circuit 16a is now implemented as a variable gain with a plurality of resistors 20', 20", 20'" which may be added or subtracted to the feedback circuit as need by switches 30', 30", 30'".

Figure 3:
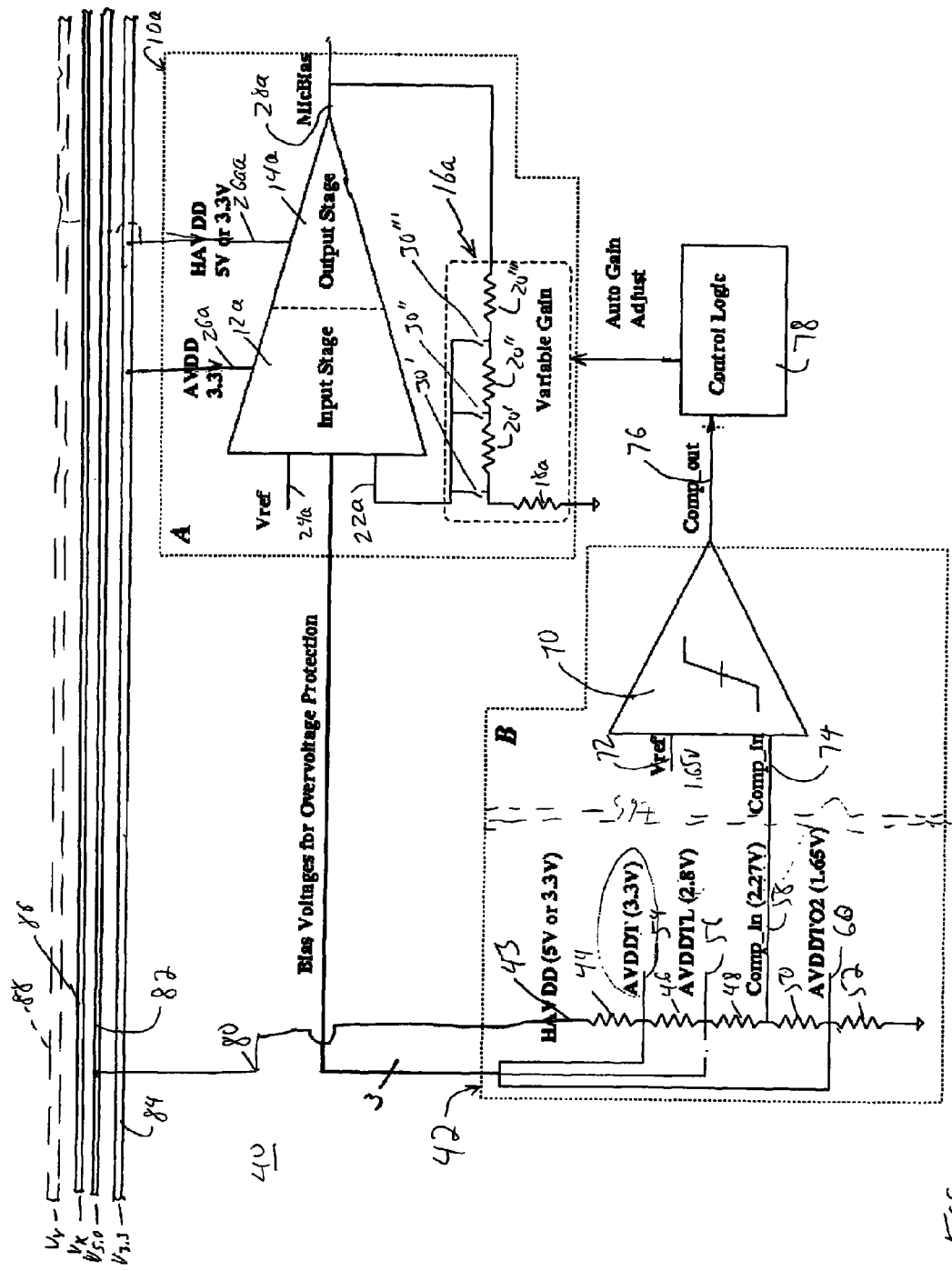
FIG. 3 is a schematic diagram of a multi-voltage biasing system with over voltage protection according to this invention implemented with the amplifier of FIG. 2

Amplifier 10a, FIG. 3, may form a part of a multi-stage biasing system 40 which includes biasing network 42. Amplifier 10a is shown as actually having a 3.3V power supply input 26a referred to as AVDD and a 5V power supply input 26aa referred to as HAVDD with at least output stage 14a including one or more output devices using 0.18 um CMOS transistor technology. It can operate safely at 3.3V but not when the power supply is at 5V. Bias network 42 includes a voltage divider which may include a set of impedances, for example, resistors 44, 46, 48, 50 and 52 which provide a set of output voltages at 54, 56, 58 and 60 that is safely below the maximum recommended voltage e.g. 3.63V for the 0.18 um CMOS technology. Even when the input 43 to voltage divider 42 is HAVDD or 5V the bias voltages AVDDT at 54 and AVDDT02 at 60 are low enough for safe operation of the 0.18 um transistors at output stage 14a and their cascode protection devices. If the input 43 to voltage divider 42 is AVDD or 3.3V those voltages are proportionally lower and even more within the safe region of operation of the output devices and their protective cascode devices in output stage 14a.

There is also a detector circuit, comparator 70, which uses a reference such as 1.65V at one input 72 to determine whether the comp_in signal on line 58 and its other input 74 is greater or lesser than its 1.65V reference. With the 5V supply HAVDD applied and a 1.65V reference at input 72 the voltage at 58 is 2.27V and so when it appears at input 74 it is greater than the 1.65V reference 72 and comparator 70 indicates that the HAVDD 5V supply is being applied. If AVDD the 3.3V supply were being applied then the voltages at AVDDT 54 would be 2.18V at AVDDTL 56 would be 1.85V at comp_in 58 would be 1.51V and at AVDDT02 would be 1.09V. With this lower voltage developed at comp_in 58 in the neighborhood of 1.51V the 1.65V at Vref 72 would be higher than the input of 74 and so comparator 70 would indicate that the lower voltage AVDD 3.3V power supply had been applied. So if it is greater, comparator 70 indicates that a 5V supply is being used, if lesser that a 3.3V supply is being used. This output at 76 drives control logic 78 to increase or decrease the gain provided by variable gain feedback circuit 16a by operating for example, switches 30', 30", 30'" e.g. if HAVDD the 5V supply is applied gain is increased, if AVDD the 3.3V supply is applied the gain is decreased. Input 80 to bias network 42 is shown connected to the HAVDD 5V bus 82 but it may as well, as previously explained, be connected to the AVDD 3.3V bus 84. Similarly, input stage 12a has been shown with its power supply input 26a connected to 3.3V bus 84. Power supply input 26aa of output stage 14a may be connected either to 3.3V bus 84 or the 5V bus 82. Further although this embodiment has been disclosed as a dual power supply biasing system, this is not a necessary limitation of the invention, as additional voltages could be accommodated such as voltages Vx and Vy appearing on buses 86 and 88 for example.

Figure 4:
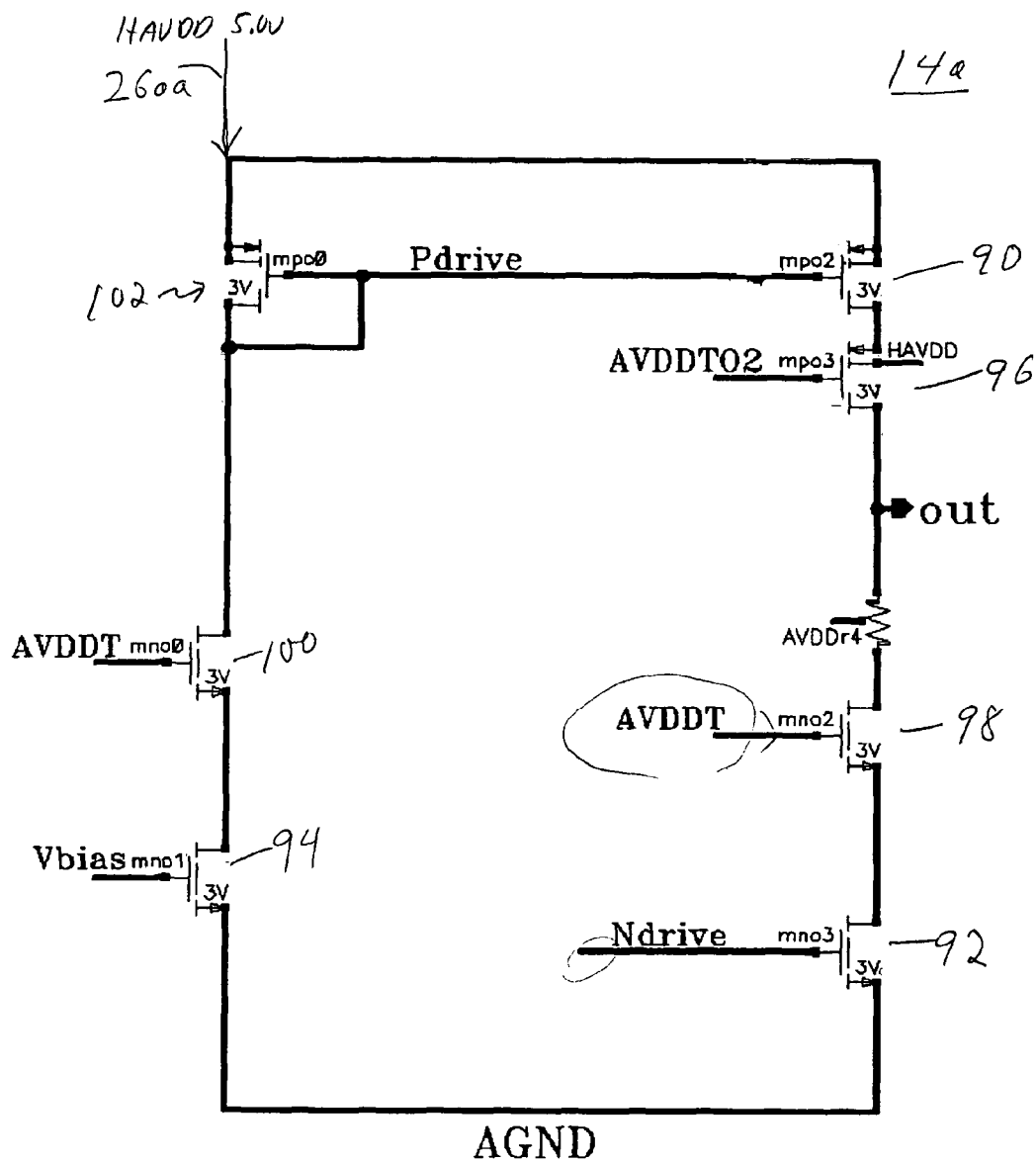
FIG. 4 is a more detailed schematic diagram of the output stage of FIGS. 2 and 3.

These bias voltages produced by voltage bias network 42, FIG. 3, are applied to output stage 14a, FIG. 4. Output stage 14a includes a number of output devices 90, 92, 94, 102 each of which has associated with it a cascode protection device 96, 98, 100, respectively. In this embodiment with each of these devices being a 0.18 um CMOS technology and having a maximum recommended voltage of approximately 3.63V, the AVDDT02 gate bias to protection device 96 as well as the AVDDT gate biases to protection devices 98 and 100 insure that the voltage applied as HAVDD 5V at 26aa for example, will be controlled so that neither the cascode protection device e.g. 96 nor its associated output device 90 will have more than, for example, 3V across its junctions which is well below the 3.63V maximum recommended voltage. Although in this embodiment only the output stage is shown provided with these cascode protection devices, this is not a necessary limitation of the invention as, for example, the input stage or any other stages could be similarly protected. The invention thus results in a robust biasing circuit which can accept any one or more power supplies of different voltages even where one of them is above the maximum recommended voltage of the devices used and it makes no difference whether the higher or lower voltage power supply powers up first. Although the specific embodiment is directed to protection of 0.18 um CMOS technology devices this is not a limitation of the invention. Further, although this invention is disclosed as a biasing system this, too, is not a limitation of the invention: it may as well be applied to a conventional amplifier or signal processing system.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A multi-voltage biasing system with over-voltage protection comprising:
   an amplifier having a stage including at least one output device and one cascode protection device, each device having a predetermined maximum recommended voltage, the stage being powered by one of a plurality of different supply voltages at least one of which is higher than said maximum recommended voltage; and
   a biasing network powered by the one of the different supply voltages, the biasing network providing to said stage a bias voltage to operate said cascode device and output device below their maximum recommended voltages.

2. The multi-voltage biasing system of claim 1 further including a detector circuit for detecting the supply voltage applied to said biasing network.

3. The multi-voltage biasing system of claim 2 further including a variable gain circuit for setting the gain of said amplifier and a control logic circuit responsive to the detected supply voltage for adjusting the gain of said amplifier.

4. The multi-voltage biasing system of claim 1 in which said stage is an output stage.

5. The multi-voltage biasing system of claim 4 in which said amplifier includes an input stage and said output stage and said input stage has applied to it a supply voltage below said maximum recommended voltage and said output stage has a supply voltage above or below said maximum recommended voltage applied to it.

6. The multi-voltage biasing system of claim 1 in which said biasing network includes a voltage divider.

7. The multi-voltage biasing system of claim 6 in which said biasing network includes a resistance voltage divider.

8. The multi-voltage biasing system of claim 1 in which said stage includes a plurality of output devices and cascode protection devices.

9. The multi-voltage biasing system of claim 8 in which said devices are transistors.

10. The multi-voltage biasing system of claim 9 in which said devices are CMOS transistors.

11. The multi-voltage biasing system of claim 1 in which said amplifier is fabricated in 0.18 um CMOS technology.

12. The multi-voltage biasing system of claim 1 in which said amplifier provides a bias for a microphone.

13. The multi-voltage biasing system of claim 1 in which said supply voltages include approximately 5.0 volts and 3.3 volts and said maximum recommended voltage is approximately 3.63V volts.

14. A dual power supply microphone biasing system comprising:
   an amplifier having an input stage and an output stage including at least one output device and one cascode protection device, each device having a predetermined maximum recommended voltage, the output stage being powered by one of a plurality of different supply voltages at least one of which is higher than said maximum recommended voltage; and
   a biasing network powered by the one of the different supply voltages, the biasing network providing to said output stage a bias voltage to operate said cascode device and output device below their maximum recommended voltages.

15. The multi-voltage biasing system of claim 14 further including a detector circuit for detecting the supply voltage applied to said biasing network.

16. The multi-voltage biasing system of claim 15 further including a variable gain circuit for setting the gain of said amplifier and a control logic circuit responsive to the detected supply voltage for adjusting the gain of said amplifier.

17. The multi-voltage biasing system of claim 14 in which said input stage has applied to it a supply voltage below said maximum recommended voltage and said output stage has a supply voltage above or below said maximum recommended voltage applied to it.

18. The multi-voltage biasing system of claim 14 in which said biasing network includes a voltage divider.

19. The multi-voltage biasing system of claim 18 in which said biasing network includes a resistance voltage divider.

20. The multi-voltage biasing system of claim 14 in which said output stage includes a plurality of output devices and cascode protection devices.

21. The multi-voltage biasing system of claim 20 in which said devices are transistors.

22. The multi-voltage biasing system of claim 21 in which said devices are CMOS transistors.

23. The multi-voltage biasing system of claim 14 in which said amplifier is fabricated in 0.18 um CMOS technology.

24. The multi-voltage biasing system of claim 14 in which said supply voltages include approximately 5.0 volts and 3.3 volts and said maximum recommended voltage is approximately 3.63V volts.

25. A multi-voltage system with over-voltage protection comprising:
   an amplifier having a stage including at least one output device and one cascode protection device, each device having a predetermined maximum recommended voltage, the stage being powered by one of a plurality of different supply voltages at least one of which is higher than said maximum recommended voltage; and
   a biasing network powered by the one of the different supply voltages the biasing network providing to said stage a bias voltage to operate said cascode device and output device below their maximum recommended voltages.

* * * * *